(12) United States Patent
Sievers

(10) Patent No.: US 8,389,203 B2
(45) Date of Patent: *Mar. 5, 2013

(54) EXPOSING PRINTING PLATES USING LIGHT EMITTING DIODES

(75) Inventor: Wolfgang Sievers, Kremperheide (DE)

(73) Assignee: Esko-Graphics Imaging GmbH, Itzehoe (DE)

(*) Notice: Subject to any disclaimer, the term of this patent is extended or adjusted under 35 U.S.C. 154(b) by 505 days.

This patent is subject to a terminal disclaimer.

(21) Appl. No.: 12/113,001

(22) Filed: Apr. 30, 2008

(65) Prior Publication Data

US 2008/0280227 A1 Nov. 13, 2008

Related U.S. Application Data

(60) Provisional application No. 60/945,439, filed on Jun. 21, 2007, provisional application No. 60/945,189, filed on Jun. 20, 2007, provisional application No. 60/916,738, filed on May 8, 2007.

(51) Int. Cl.
  *B41M 5/00* (2006.01)
  *G03F 7/00* (2006.01)
(52) U.S. Cl. ............ 430/306; 430/302; 101/463.1
(58) Field of Classification Search ............ 430/270.1, 430/306; 101/450.1
See application file for complete search history.

(56) References Cited

U.S. PATENT DOCUMENTS

| | | | | |
|---|---|---|---|---|
| 4,899,214 A | * | 2/1990 | Robbins et al. | 358/515 |
| 4,916,530 A | * | 4/1990 | Neilson et al. | 347/238 |
| 5,386,268 A | * | 1/1995 | Ohlig et al. | 355/70 |
| 6,683,421 B1 | * | 1/2004 | Kennedy et al. | 315/291 |
| 7,137,696 B2 | | 11/2006 | Siegel | 347/102 |
| 2005/0011382 A1 | * | 1/2005 | Donahue et al. | 101/401.1 |
| 2005/0183597 A1 | * | 8/2005 | Hull et al. | 101/401.1 |
| 2005/0266358 A1 | * | 12/2005 | Roberts et al. | 430/394 |
| 2006/0054040 A1 | * | 3/2006 | Daems et al. | 101/463.1 |

OTHER PUBLICATIONS

Paul Mills, Characterizing the Output and Performance of Solid-State UV LED Sources, 2005 RadTech Europe conference and exhibition, Barcelona, Spain, Oct. 18-20, 2005, retrieved on Jun. 19, 2007 at http://www.radtech-europe.com/files_content/millspapernovember2006.pdf.

"Cure-All Linear 100," US Process Supply, Inc. Portland, OR, retrieved Jun. 19, 2007 at http://www.uvps.com/product.asp?code=UV+LED+++C.

Opto Technology, Inc., Wheeling, IL: Specification: Shark High Flux UV LED Illuminators model OTLH-0480-UV, retrieved on Jun. 19, 2007 from http://www.optotech.com/data_sheets/OTLH_0480_UV_13.pdf.

"How to Build a UV Curing System," US Process Supply, Inc. Portland, OR, retrieved on Jun. 29, 1007 at http://uvps.com/manuals/manual_build-complete.pdf.

Stephen B. Siegel: UV Commercialization of LED Curing: Advances in a new technology, US Process Supply, Inc. Portland, OR, retrieved Jun. 19, 2007 at http://www.uvps.com/products/Curing%20EQUIPMENT.E1.UV%20LED%20LAMPS.UV%20LED/UV%20LED%20CURE-ALL%20LINEAR.UV%20LED%20%20%20C//SupportDocs/UV%20LED%20Commercialization.pdf.

(Continued)

*Primary Examiner* — Cynthia Kelly
*Assistant Examiner* — Chanceity Robinson
(74) *Attorney, Agent, or Firm* — Dov Rosenfeld; Inventek

(57) ABSTRACT

Particular embodiments include method embodiments and apparatus embodiments. One method embodiment comprises: placing a printing plate on an imaging device; imaging the plate according to imaging data; and applying UV radiation using a plurality of UV emitting LEDs during the process of imaging of the printing plate. In one embodiment, the plate initially has ablatable material, and wherein the imaging includes ablating ablatable material on the plate according to the imaging data to form an ablated plate, and wherein the applying the UV radiation includes exposing the ablated plate to UV radiation to cure the plate. In one embodiment, the imaging device is an external drum imager that includes a drum that rotates during imaging.

18 Claims, 4 Drawing Sheets

OTHER PUBLICATIONS

Search Report issued Jan. 29, 2009 on PCT Application PCT/IB2008/001900.

International Preliminary Report issued Nov. 10, 2009 on Patentability on PCT Application PCT/IB2008/001900.

Official Communication from the European Patent Office Examining Division for Application 08788906.9 mailed Feb. 21, 2011.

* cited by examiner

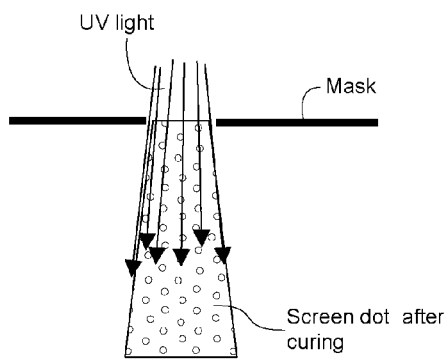
FIG. 4
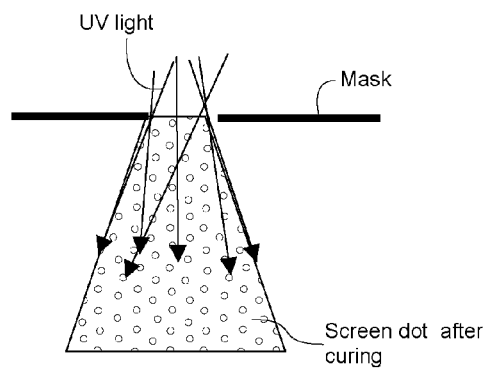
FIG. 5
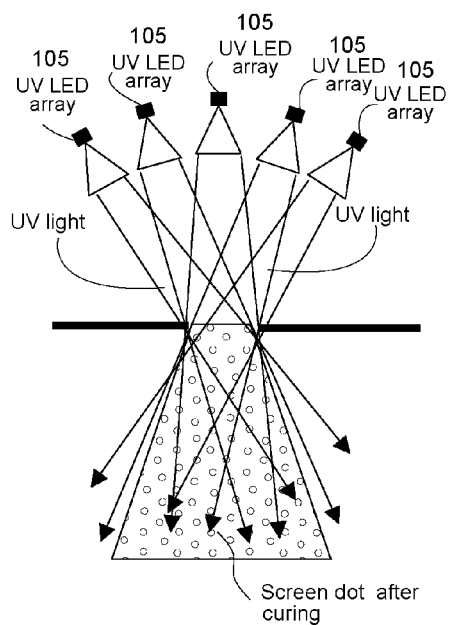
FIG. 6
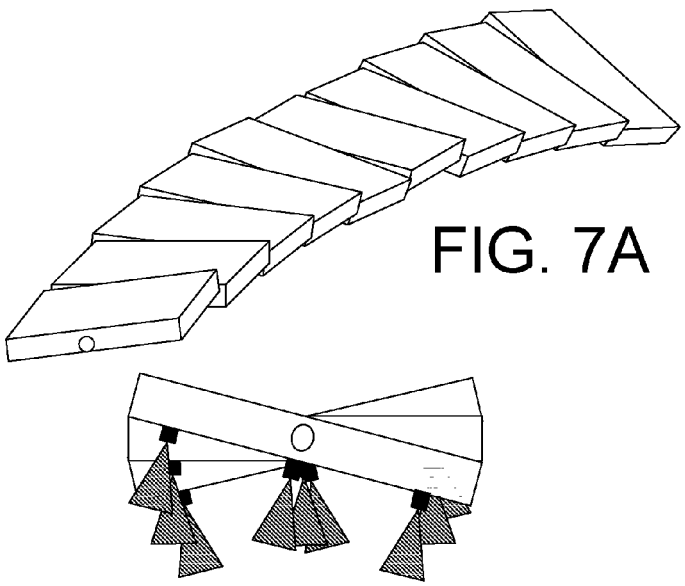
FIG. 7A
FIG. 7B

EXPOSING PRINTING PLATES USING LIGHT EMITTING DIODES

RELATED APPLICATION

The present invention claims benefit of priority of, and is a conversion of U.S. Provisional Patent Applications Nos. 60/945,439 filed 21 Jun. 2007 to inventor Sievers, 60/945,189 filed 20 Jun. 2007 to inventor Sievers, and 60/916,738 filed 8 May 2007 to inventors Wolterink et al. The contents of such U.S. Provisional Patent Applications Nos. 60/945,439, 60/945,189, and 60/916,738 are incorporated herein by reference.

FIELD OF THE INVENTION

The present invention relates generally to printing, and in particular to curing printing plates having photo-curable material thereon using a solid state source of radiation.

BACKGROUND

Preparing printing plates such as photopolymer flexographic plates and letterpress printing plates coated with photopolymer material (such plates in general referred to as "polymer plates") is being more and more automated. A typical process of preparing such printing plates includes starting with a plate that has an ablatable material thereon, imaging in a digital imager to ablate the ablatable material according to imaging data, and a curing process of the exposed plate that involves exposure to light energy, e.g., ultraviolet (UV) light energy. Automation often includes inline exposure to cure the plate inline after imaging.

Polymer plates as described herein include plates for flexography made of a material such as photopolymer material that can be cured by exposure to UV, and also letterpress plates (e.g., lithographic plates) that have a photopolymer material coated thereon that is exposed by UV material to cure the coating. Polymer plates as used herein also include cylinders with photo-curable coatings thereon, sometimes called polymer sleeves or photopolymer sleeves. Note that the term "polymer" is not meant to limit the composition of the photo-curable material. Any photo-curable material that is curable by UV radiation is included.

Many polymer plates are optimized for a 365 nm curing wavelength. Depending on the speed by which the polymer plate is imaged, there has to be sufficient UV power available to do sufficient UV curing of the polymer during the inline exposure. For 4 m$^2$/h productivity, the UV power at 365 nm has to be around 150 Watts. State of the art systems that include such so called inline exposure typically use gas filled arc lamps to generate sufficiently high levels of UV energy in the required wavelength or wavelengths. Such arc lamps consume up to several Kilowatts of electrical power to provide the required amount of exposure energy. Furthermore, as much as 98% of this energy is converted into heat or other unwanted wavelengths, and needs to be filtered out and cooled away from the polymer plate. The conversion efficiency of such arc-lamp-based inline exposure systems is usually not better than 1.5% to 2%. Furthermore, such arc lamps run at high voltages, e.g., several hundred to several thousand Volts. Furthermore, such arc lamps typically need to be cooled, e.g., water cooled in order to remove the enormous amounts of waste heat and radiation not needed for the curing process.

The combination of the need for a relatively high voltage and for water or other types of cooling is potentially hazardous.

In addition to the hazards and the waste, heating of polymer plates has a negative impact on the homogeneity of halftone screen dots, e.g., has negative impact on the appearance of a homogeneous screened area. This can further increase the amount of UV energy necessary for curing.

Furthermore, some of the wavelengths produce by such arc lamps, e.g., radiation in the UV-C range can produce artifacts such as relatively brittle screen dots that can break off the plate after as few as a few hundred or perhaps a few thousand impressions. Therefore, there is a need to filter out undesired wavelengths other than the 365 nm range of wavelengths needed to cure a plate.

Such filtering of unwanted wavelengths further reduces the curing efficiency of the 365 nm range wavelength, so that the amount of 365 nm energy necessary for curing is raised.

Arc lamps also are known to produce a light source that is relatively not very diffuse. This causes very thin and small support shoulders of screen dots on a printing plate. Often complex reflector geometries are used in an attempt to compensate for the non-diffuse nature of the light from an arc lamp.

Furthermore, arc lamps are known to have a relatively limited life time. A life of between 500 and 2000 hours is typical.

DESCRIPTION OF THE DRAWINGS

FIG. 4 is to show how a light source with relatively low diffusion results in a screen dot with a narrow support structure.

FIG. 5 is to show how a light source with relatively high diffusion results in a screen dot with a relatively wide support structure.

FIG. 6 shows one embodiment of the invention in which a plurality of LED arrays are arranged at different angles.

FIG. 7A shows an embodiment of the invention in which a mounting ring is divided into segments that hold the LED arrays with each segment tiltable with respect to the drum's axis of rotation.

FIG. 7B shows an embodiment of a segment of a mounting ring that is tiltable with respect to the drum's axis of rotation and has LED arrays mounted on it.

DESCRIPTION OF EXAMPLE EMBODIMENTS

Figure 1A:
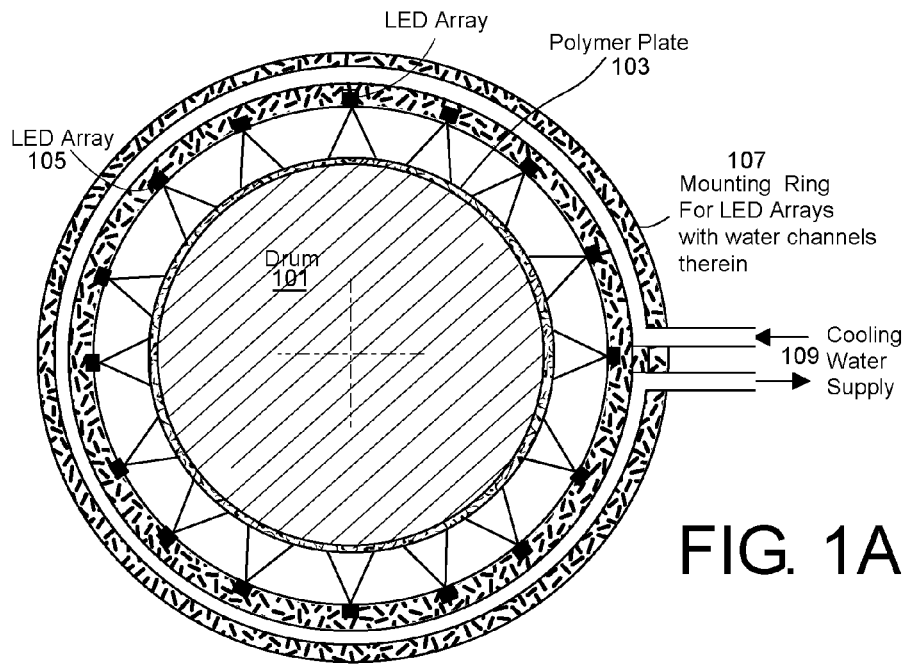
FIG. 1A shows in a simple cross-sectional view one embodiment of an LED-based exposure system that includes features of the present invention.

Embodiments of the present invention include an apparatus configured to expose a plate that has a photocurable material thereon, the exposing using light emitting diodes (LEDs) to cure of the photocurable material thereon. Embodiments further include a method of exposing a plate that has a photocurable material thereon, such as a polymer flexographic plate, a polymer-coated letterpress plate, or a polymer cylinder with UV radiation using LEDs rather than arc lamps.

Throughout the specification and claims, it is to be understood that by exposing a plate is meant exposing a plate that has a photocurable material thereon to cure the material thereon using UV radiation. Plates as described herein are plates that have a photocurable material thereon, and include polymer plates. Such a polymer plate may be a plate for flexography made of a photopolymer material that can be cured by exposure to UV. Such a polymer plate may alternately be a letterpress plate that has a photopolymer material coated thereon and that is exposed by UV material to cure the coating. Such a polymer plate may alternately be a plate on a cylinder. A plate on a cylinder may be a cylinder made of carbon fiber or glass fiber which is coated with a layer of photopolymer that is curable by UV radiation. Such cylinders with a plate thereon are sometimes referred to as polymer sleeves and photopolymer sleeves.

Thus the present invention covers the exposing of any plate of any shape that has photocurable material thereon, e.g., a photopolymer. The present invention is thus applicable to all printing plates on which curing by exposure to UV radiation is applicable.

The term printing plate is understood to mean such a plate herein.

Overview

Embodiments of the present invention include methods and apparatuses that include exposing a plate to UV radiation using UV emitting LEDs.

Particular embodiments include a method comprising: placing a printing plate on an imaging device; imaging the plate according to imaging data; and applying UV radiation using a plurality of UV emitting LEDs during the process of imaging of the printing plate. In one embodiment, the plate initially has ablatable material, and wherein the imaging includes ablating ablatable material on the plate according to the imaging data to form an ablated plate, and wherein the applying of the UV radiation includes exposing the ablated plate to UV radiation to cure the plate. In one embodiment, the imaging device is an external drum imager that includes a drum that rotates during imaging.

Particular embodiments include a method comprising: placing a printing plate on an imaging device; imaging the plate according to imaging data; removing the imaged plate; and applying UV radiation to the back of the printing plate using a plurality of UV emitting LEDs during or after the removing of the imaged printing plate.

Particular embodiments include a method comprising: placing a printing plate on an imaging device; imaging the plate according to imaging data; removing the imaged plate; and applying UV radiation to the back or front of the printing plate or to both the front and the back of the printing plate using a plurality of UV emitting LEDs during or after the placing of the plate or the removing of the imaged printing plate.

Particular embodiments include an apparatus comprising: a rotatable imaging drum arranged to have a plate or a sleeve with a plate thereon, the drum operative to rotate during an imaging process; a source of one or more laser beams coupled to a source of image data and operable to image a plate on the drum, including moving in the direction of the axis of rotation of the drum during the imaging process; and a plurality of UV emitting LEDs operative to expose at least an imaged portion of the plate during the imaging process to cure the at least imaged portion of the plate.

In one embodiment, the plate initially has ablatable material, and wherein the imaging ablates ablatable material on the plate according to the imaging data to form an ablated plate. In one embodiment, the plurality of LEDs is in the form of a plurality of arrays of LEDs.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Using UV LEDs

LEDs that produce energy in the wavelength range suitable for exposing polymer plates are already available, and are used, e.g., for curing inks, such as inkjet inks. However, the amount of energy required for UV curing of a plate is relatively high. The inventor has recognized that LEDs that can produce light in the useful UV wavelength range have reached a stage of development where they are not only rugged and reliable, but also deliver sufficient output powers, that is, if enough of them are used, sufficient energy is available for the curing of plates.

LED arrays which provide about 0.25 Watts of UV@365 nm are already available. For example, Opto Technology, Inc. of Wheeling, Ill., for example, has an array of LEDs packaged in a TO-66 package called "Shark"™ that can be mounted on a heatsink, and that produces UV at the 375 nm range. The company is planning a 365 nm version that is in the wavelength range for curing printing plates. For 150 Watts of UV energy, a device with an array of 600 LEDs is usable for inline UV exposure of plates at an approximate rate of 4 m²/h.

The conversion efficiency for such LEDs is around 4-5% which is twice as good as arc lamps.

Waste energy is converted into heat. One version of the arrays is on a package mountable on a heatsink. In one embodiment, the excess heat is removed by using water cooled heatsinks with the LEDs. This reduces the heat to which the polymer plates are exposed. Insulation material further can be sued to mask heat radiated from the heatsinks towards the plates.

Thus the inventor recognizes that LEDs need less energy not only because of their better electro/optical conversion efficiency but also due to better process efficiency.

Also LEDs are known to last longer than typical arc lamps. Given sufficient cooling, LEDs should be able to operate for more than 10,000 hours, which is 5 to 20 times more than typical arc lamps used for inline exposure.

Furthermore, LEDs are powered by relatively low voltage DC power compared to arc lamps.

Thus, the inventor recognizes that it is possible to use multiple UV LEDs, e.g., multiple UV LED arrays for plate curing.

FIG. 1A shows in a simple cross-sectional view one embodiment of an LED-based exposure system that works with an external drum digital imager that includes a rotating drum 101 around which a plate 103 such as a flexographic plate that has an ablatable mask thereon is placed to be imaged by one or more lasers modulated according to imaging data.

Define the axial direction as the direction of the axis of rotation of the drum. One embodiment of the digital imager includes the source of laser light 113 modulated by the imaging data moving in the axial direction during rotation of the drum so that the imaging data eventually images the whole drum by ablating the mask material.

One embodiment includes a plurality of LED arrays 105 mounted on the inside surface of a mounting ring 107 made of heatsink material that is placed around the circumference of the drum 101 so that the LED arrays 105 expose the surface of the drum 101 or a plate 103 thereon when turned on. The mounting of the LED arrays 105 includes thermally coupling the LED arrays 105 to the heatsink material. One embodiment uses common TO-66 packaged LEDs.

Note that, for the purpose of describing embodiments of the invention, like elements that are used in different drawings or configurations have the same reference numeral. For example, LED arrays in any example embodiment of the invention use reference numeral 105. Those in the art will understand, however, that these arrays may not be identical or substitutable from embodiment to embodiment.

The mounting ring 107 is movable in the axial direction and is arranged to follow the modulated laser beam or beams 113, so that as the drum rotates and the plate 103 thereon is imaged, the plate 103 after imaging, i.e., with the mask thereon ablated according to the imaging data is exposed to UV radiation from the LED array(s) 105. The mounting ring 107 thus moves in the axial direction relative to the surface of the drum at the same rate and behind the modulated laser beam(s) 113.

In FIG. 1A, the mounting ring 107 included cooling channels—water channels—to which is coupled a supply of cooling liquid 109, e.g., water.

In one embodiment, as an additional measure, the inside surface of the mounting ring 107 other than where the LED arrays 105 emit their energy is insulated so that heat is not radiated in the direction of the drum 101.

Figure 1B:
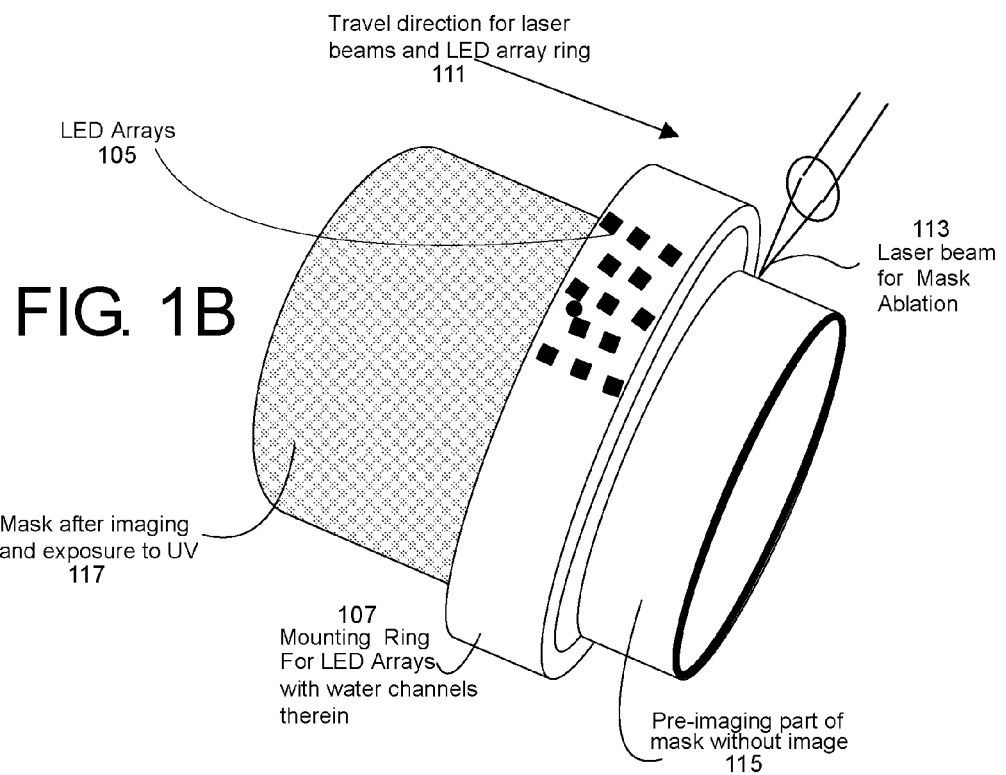
FIG. 1B shows a simplified perspective view of elements of one embodiment of the invention.

FIG. 1B shows the arrangement in a simplified perspective view. The direction of motion of the laser beam(s) 113 and mounting ring 107 is shown as direction 111, and is shown left to right relative to the rotating drum 101.

Figure 2:
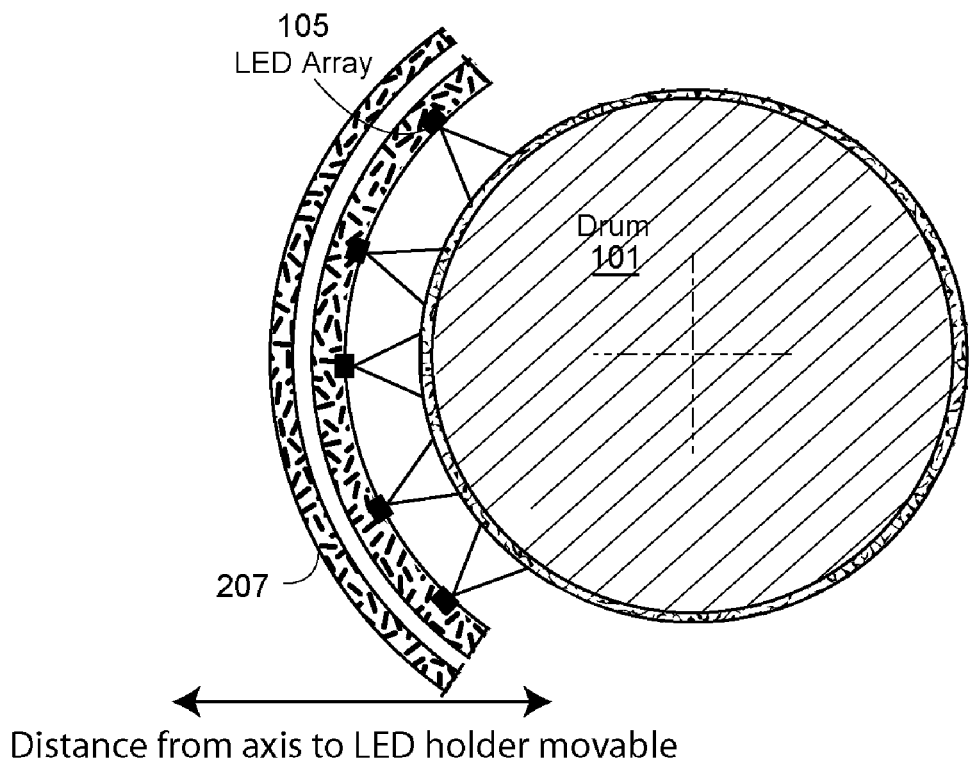
FIG. 2 shows another embodiment of the invention in which an LED holder that holds one or more arrays of LEDs is arranged as a segment of a ring rather than as the mounting ring of the embodiment of FIGS. 1A and 1B.

FIG. 2 shows another embodiment in which an LED holder 207 that holds one or more arrays of LEDs 105 is arranged as a segment of a ring rather than as the mounting ring 107 of the embodiment of FIGS. 1A and 1B. In one embodiment, the LED holder 207 covers about 90 degrees, so it is in the form of a quarter-ring.

One such embodiment includes a mechanism that allows the distance from the axis of rotation to the ring holder 207 to be varied. This allows the exposing unit to be used with drums of a plurality of diameters, with the distance changed to accommodate any particular diameter.

This embodiment is for drums, or sleeves that have relatively small diameters. The arrangement of FIG. 1 might not be suitable such cases, because there might not be sufficient surface to place a sufficient number of LEDs around the circumference.

One such embodiment is suitable for use with a range of drum or sleeve diameters.

Figure 3:
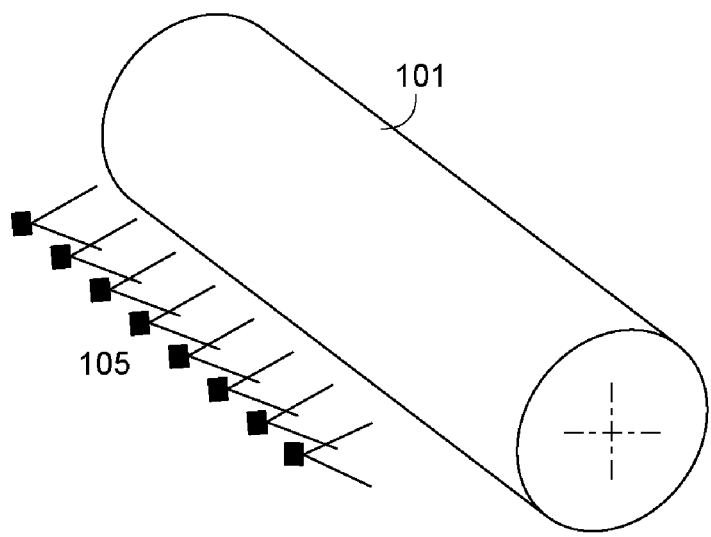
FIG. 3 shows a different embodiment of the invention in which the LEDs are arranged in a segment that is moveable towards and away from the axis of rotation of the drum.

FIG. 3 shows a simple perspective view of another embodiment that, like the embodiment of FIG. 2, is suitable for small diameter drums or sleeves, and also that provides for having different drums or sleeves of different sizes. In FIG. 3, the LED holder does not move in the axial direction, e.g., does not follow the laser beam in the axial direction, but is fixed in such a direction. The holder for the LED array(s) 105 extends the whole length of the drum. One such embodiment still provides for varying the distance from the LED array(s) and the axis of rotation of the drum to accommodate different drums or sleeves of different diameters.

FIG. 4 shows a problem that can occur with arc lamps without reflector geometries that avoid the relatively high brightness of such sources. Such arc lamps, without complex reflector structures, may cause small, steep support shoulders of the screen dots as shown in FIG. 4. These support shoulders give relatively little support during printing, and may cause the screen dot to bend under pressure as might occur during printing.

Complex reflector geometries are usually added to arc lamps to lower the brightness and produce more divergence and diffusion in the beam. Such lower brightness and high divergence and diffusion create broader shoulders in the cured polymer, as shown for a one halftone dot in FIG. 5.

FIG. 6 shows how using a plurality of LEDs or LED arrays 105 can help produce a widely divergent (diffuse) beam. Each of the LED arrays 105 is placed to provide radiation at a slightly different angle. A relatively large number of such LED arrays is used in one embodiment, so that the LEDs can be aimed differently to produce a relatively divergent set of beams, resulting in broad shoulders. This is illustrated in FIG. 6 which shows five arrays 105 producing in combination a divergent set of beams, resulting, in this illustration, in a cured halftone dot that has relatively broad shoulders, compared, e.g., to the halftone dot shown in FIG. 4.

FIG. 7A shows a perspective view and FIG. 7B shows an end view of a part of a ring structure on which the LED arrays 105 are mounted. The rings structure is made up of a plurality of segments, onto which are mounted the LED arrays 105. The segments are each tilted at a different angle relative to the axis of rotation of the drum, so that beams at different directions are produced.

Figure 8:
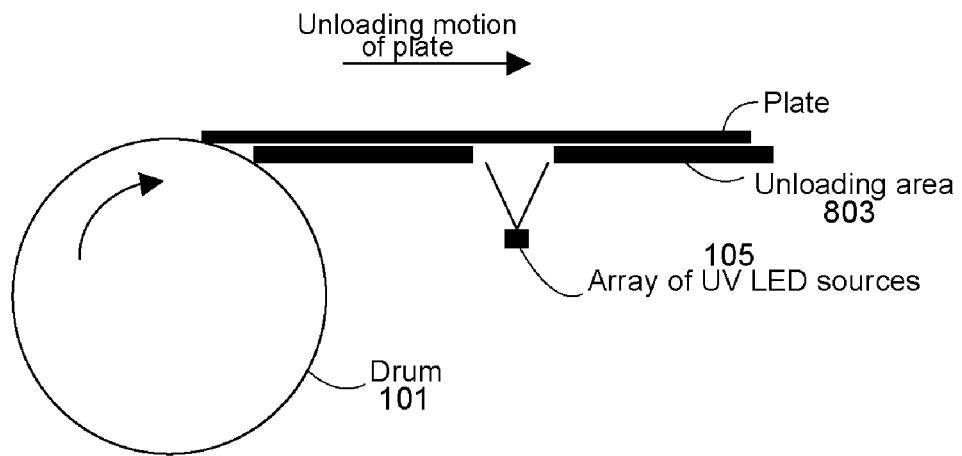
FIG. 8 shows one embodiment of the invention in which the LED arrays are arranged in a line at the location where a polymer plate travels along during unloading from the drum such that the back of the plate can be exposed.

While the above describes using UV LED sources for curing of the plate material from the top through the mask, it is also known that back-exposure improves the quality of plates, e.g., flexographic plates. FIG. 8 shows in simplified form an apparatus usable to expose the back of such plates after imaging as part of the process of unloading a plate from the drum imager. An array of UV LEDs 105, or an array of arrays of UV LEDs' is placed along the width of an unloading area 803 onto which a plate is unloaded from an imaging drum 101 so that there is in-line exposure during unloading. The unloading area 803 has a window underneath the plate when on the loading area that allows UV radiation from the bottom under the unloading area to irradiate the back of the plate after imaging, e.g., in the process of unloading. The energy density is calculated so that the plate may be moved over the array of (arrays of) UV LEDs to sufficiently expose the back of the plate.

U.S. Provisional Patent Application No. 60/916,738 filed May 8, 2007 to inventors Wolterink et. al, and titled METHOD AND APPARATUS FOR LOADING AND UNLOADING FLEXOGRAPHIC PLATES FOR COMPUTER-TO-PLATE IMAGING INCLUDING SEPARATE LOADING AND UNLOADING AREAS described automatic inline exposure. The contents of such Patent Application No. 60/916,738 are incorporated herein by reference. An implementation of the present invention can be added to any of the embodiments described in U.S. Patent Application No. 60/916,738, in the form of a set of arrays of UV LEDs for front exposure, back exposure, or both front and back exposure. How to so modify the description of any embodiment described in U.S. Patent Application No. 60/916,738 would be clear to one in the art from the description herein and in the cited Wolterlink et al. patent application.

Figure 9:
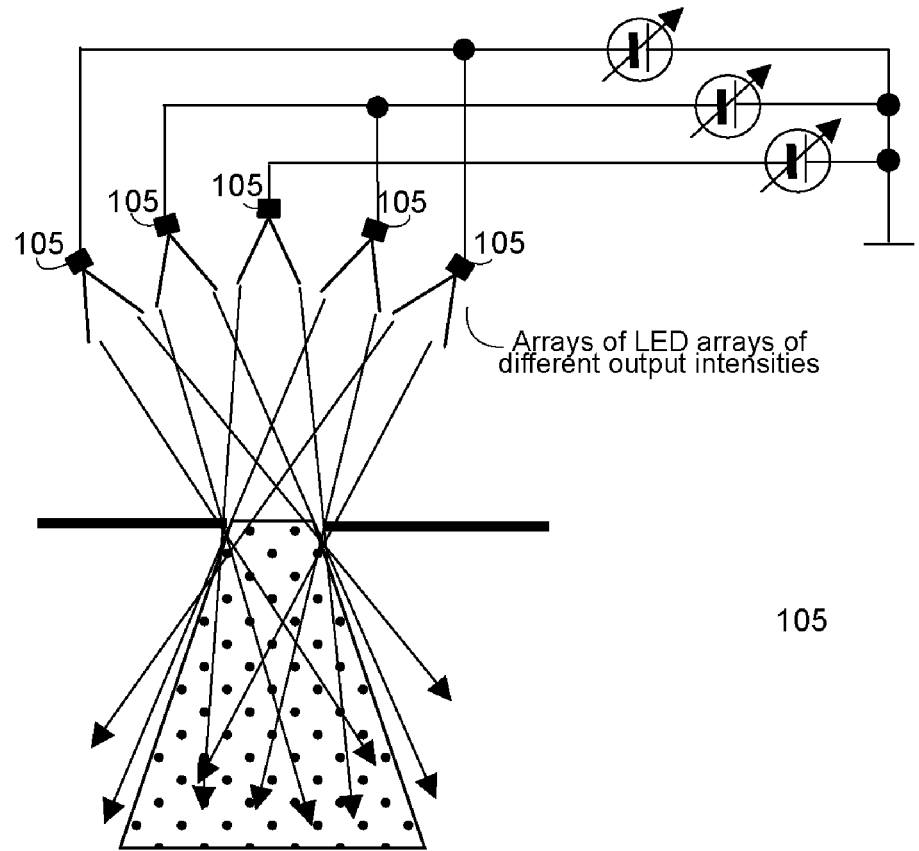
FIG. 9 shows another embodiment of the invention in which LED arrays of different wavelengths are used.

FIG. 9 shows in simplified form another embodiment wherein the LED arrays 105 operate at a variety of wavelengths in order to influence one or more properties of the cured material. In the simplified drawing, three different UV LED wavelengths are used each to drive one or more arrays of LEDs, in this case, using three different power supplies. By having each set of LEDs of a particular wavelength driven by its own power supply that is independently controlled, the wavelength mixture, e.g., the relative amount of each wavelength for the exposure can be precisely controlled. By having individual control, not only the intensity, but the exposure time for each component wavelength can also be precisely controlled.

Yet another embodiment replaces common back exposure systems that use one or more arc lamps for UV exposure of a plate after imaging by an exposure system that uses a plurality of LEDs or arrays of LEDs for the UV exposure. In one embodiment, such an exposure unit exposes the area of a whole plate. In another embodiment, the exposure unit exposes the width of a plate, and the plate travels relative to the source of UV radiation.

Many of the features described above are included in different embodiments of the LED exposure system that replaces a conventional bank exposure unit. In one embodiment, the exposure unit includes heatsink material on which the LEDs are mounted. In one version, the LEDs are oriented in a plurality of directions to produce UV beams of wider divergence, e.g., more disperse, so that the curing of the plate material produces better edges. In one version, LEDs of several wavelengths are used, each set of LEDs of different wavelengths driven by its independently controllable power source, so that the radiation produced can be tailored to be made up of different amounts of the wavelengths of the LEDs for spectral shaping.

Thus has been described use of UV LEDs or LED-arrays for curing photopolymer plates during the imaging process. Thus also has been described use of UV LEDs or LED-arrays for curing photopolymer plates after the imaging process. This may offer several advantages over state of the art arc lamps. One embodiment described includes LEDs arranged on the inner side of a ring which surrounds the surface of a rotatable drum of a drum imaging device. A photopolymer plate may be placed on the surface. The ring of LEDs travels in the axial during the laser imaging process to cure the imaged plate during the imaging process.

One feature compared to arc lamp curing is the relative absence of heat radiation, which otherwise may have negative impact on the curing process.

Another feature is that LEDs can be designed to only the wavelength (or wavelengths for a plurality of LEDs) needed for the curing process. Other wavelengths which reduce the quality of the cured plate are not present and so need not be filtered out.

Another feature is easy relative ease of adjustment of the curing light divergence by arranging the plurality of LEDs at various angles with respect to the plate surface. A more divergent set of beams may produce better curing than a less divergent set of beams.

General

By the terms "polymer plate" and "photopolymer plate" herein is meant a plate with any type of UV-curable material thereon. Today, such materials are photopolymers. However, the term "photopolymer" is not meant to be limiting to a polymer composition. The inventor anticipates that in the future, there may be new materials and compositions that also are curable y UV radiation of a desired wavelength, and the invention is equally applicable to plates having such material thereon.

Unless specifically stated otherwise, as apparent from the following discussions, it is appreciated that throughout the specification discussions utilizing terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., steps is implied, unless specifically stated.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All publications, patents, and patent applications cited herein are hereby incorporated by reference.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

I claim:

1. A method comprising:
   placing a printing plate with photo-curable material thereon on an imaging device, wherein the plate initially has ablatable masking material on the photo-curable material;
   imaging the plate according to imaging data to format least an imaged portion of the plate, wherein the imaging includes ablating some of the ablatable masking material on the photo-curable material according to the imaging data to form a mask ablated according to the imaging data on the plate; and
   applying UV radiation to the at least imaged portion of the plate by exposing the plate with the ablated masking material thereon to the UV radiation using a plurality of UV emitting LEDs to cure photo-curable material on the at least imaged portion of the plate during the process of imaging of the printing plate,
   wherein the printing plate is a photopolymer flexographic plate initially having the ablatable masking material thereon, a photopolymer letterpress plate initially having the ablatable masking material thereon, or a photopolymer sleeve initially having the ablatable masking material thereon, such that imaging of one part of the plate and curing of an imaged portion of the plate occur simultaneously.

2. A method as recited in claim 1, wherein the imaging device is an external drum imager that includes a drum that rotates during imaging.

3. A method as recited in claim 1, wherein the applying of UV radiation is to cure an imaged photopolymer plate after ablatable material has been ablated from the surface of the plate according to imaging data.

4. A method as recited in claim 1, wherein the LEDs are in the form of a plurality of arrays of LEDs.

5. A method as recited in claim 2, wherein the LEDs are arranged around a part of the circumference of the drum of the imaging device, mounted on a ring or part of a ring, and wherein exposure of the complete circumference to the UV radiation occurs by rotating the drum during the applying of the UV radiation.

6. A method as recited in claim 5, wherein the ring or ring part is movable in the axial direction of the axis of rotation of the drum, wherein the imaging is by one or more modulated beams that move along the axial direction relative to the surface of the drum while the drum rotates during imaging, and wherein the ring or ring part moves with the one or more modulated beams during imaging after the one or more beams to expose the imaged plate to UV radiation at the same time as at least some of the plate is being imaged.

7. A method as recited in claim 5, wherein the LEDs are arranged around part of the circumference on a ring part, and wherein the distance from the ring part to the axis of rotation of the drum is adjustable to accommodate drums or sleeves of different diameter.

8. A method as recited in claim 7, wherein the LEDs are arranged around part of the circumference on a ring part, and extend across the length of the drum.

9. A method as recited in claim 1, wherein the LEDs are mounted on a heatsink to remove heat generated during the applying of UV radiation.

10. A method as recited in claim 9, wherein the heatsink includes channels for liquid, the method further comprising:
    supplying cooling liquid through the channels to remove heat from the LEDs during operation.

11. A method as recited in claim 9, further comprising forcing air onto the heatsink to remove the heat load by forced air cooling.

12. A method as recited in claim 2, wherein the divergence of the UV radiation is adjustable by tilting some of the LEDs differently with respect to the drum rotation axis so that the beams from the LEDs are in a plurality of directions to add diffusion to the beams.

13. A method as recited in claim 12, wherein the LEDs are mounted on a plurality of panels, each panel having one or more LEDs, each panel tiltable so that by tilting the panels at a plurality of angles, a range of UV beam directions is obtained.

14. A method as recited in claim 1, wherein the UV LEDs are of a plurality of wavelengths supplied by respective controllable power sources, further comprising:
    controlling the spectral composition of the UV produced by the LEDs by controlling the respective power sources for the LEDs.

15. A method as recited in claim 2, wherein the LEDs are arranged along a line parallel to the axis of rotation and extending along the length of the drum surface.

16. A method as recited in claim 15, wherein the distance from the LEDs to the drum surface is adjustable to accommodate a variety of drum or sleeve diameters.

17. A method comprising:

placing a printing plate with photo-curable material thereon on an imaging device, wherein the plate initially has ablatable masking material on the photo-curable material;

imaging the plate according to imaging data to form an imaged plate, wherein the imaging includes ablating some of the ablatable masking material on the photo-curable material according to the imaging data to form a mask ablated according to the imaging data on the plate, such that the imaged plate includes the mask ablated according to the imaging data;

removing the imaged plate; and applying UV radiation to the back of the printing plate using a plurality of UV emitting LEDs during or after the removing of the imaged plate, wherein the printing plate is a photopolymer flexographic plate initially having the ablatable masking material thereon, a photopolymer letterpress plate initially having the ablatable masking material thereon, or a photopolymer sleeve initially having the ablatable masking material thereon.

18. A method comprising:

placing a printing plate with photo-curable material thereon on an imaging device, wherein the plate initially has ablatable masking material on the photo-curable material;

imaging the plate according to imaging data to form an imaged plate, wherein the imaging includes ablating some of the ablatable masking material on the photo-curable material according to the imaging data to form a mask ablated according to the imaging data on the plate, such that the imaged plate includes the mask ablated according to the imaging data;

removing the imaged plate; and applying UV radiation to the back of the printing plate or to both the front and the back of the printing plate using a plurality of UV emitting LEDs during or after the placing of the plate or the removing of the imaged plate, wherein the printing plate is a photopolymer flexographic plate initially having the ablatable masking material thereon, a photopolymer letterpress plate initially having the ablatable masking material thereon, or a photopolymer sleeve initially having the ablatable masking material thereon.

* * * * *

(12) EX PARTE REEXAMINATION CERTIFICATE (10622nd)
United States Patent
Sievers

(10) Number: US 8,389,203 C1
(45) Certificate Issued: *Jun. 8, 2015

(54) EXPOSING PRINTING PLATES USING LIGHT EMITTING DIODES

(75) Inventor: Wolfgang Sievers, Kremperheide (DE)

(73) Assignee: ESKO-GRAPHICS IMAGING GMBH, Itzehoe (DE)

Reexamination Request:
No. 90/013,353, Sep. 25, 2014

Reexamination Certificate for:
Patent No.: 8,389,203
Issued: Mar. 5, 2013
Appl. No.: 12/113,001
Filed: Apr. 30, 2008

( * ) Notice: This patent is subject to a terminal disclaimer.

Related U.S. Application Data

(60) Provisional application No. 60/945,439, filed on Jun. 21, 2007, provisional application No. 60/945,189, filed on Jun. 20, 2007, provisional application No. 60/916,738, filed on May 8, 2007.

(51) Int. Cl.
| | | |
|---|---|---|
| *B41M 5/00* | (2006.01) | |
| *G03F 7/00* | (2006.01) | |
| *G03F 7/20* | (2006.01) | |
| *B41C 1/10* | (2006.01) | |
| *G03F 7/24* | (2006.01) | |

(52) U.S. Cl.
CPC ............ *G03F 7/2057* (2013.01); *B41C 1/1008* (2013.01); *G03F 7/24* (2013.01)

(58) Field of Classification Search
None
See application file for complete search history.

(56) References Cited

To view the complete listing of prior art documents cited during the proceeding for Reexamination Control Number 90/013,353, please refer to the USPTO's public Patent Application Information Retrieval (PAIR) system under the Display References tab.

*Primary Examiner* — James Menefee

(57) ABSTRACT

Particular embodiments include method embodiments and apparatus embodiments. One method embodiment comprises: placing a printing plate on an imaging device; imaging the plate according to imaging data; and applying UV radiation using a plurality of UV emitting LEDs during the process of imaging of the printing plate. In one embodiment, the plate initially has ablatable material, and wherein the imaging includes ablating ablatable material on the plate according to the imaging data to form an ablated plate, and wherein the applying the UV radiation includes exposing the ablated plate to UV radiation to cure the plate. In one embodiment, the imaging device is an external drum imager that includes a drum that rotates during imaging.

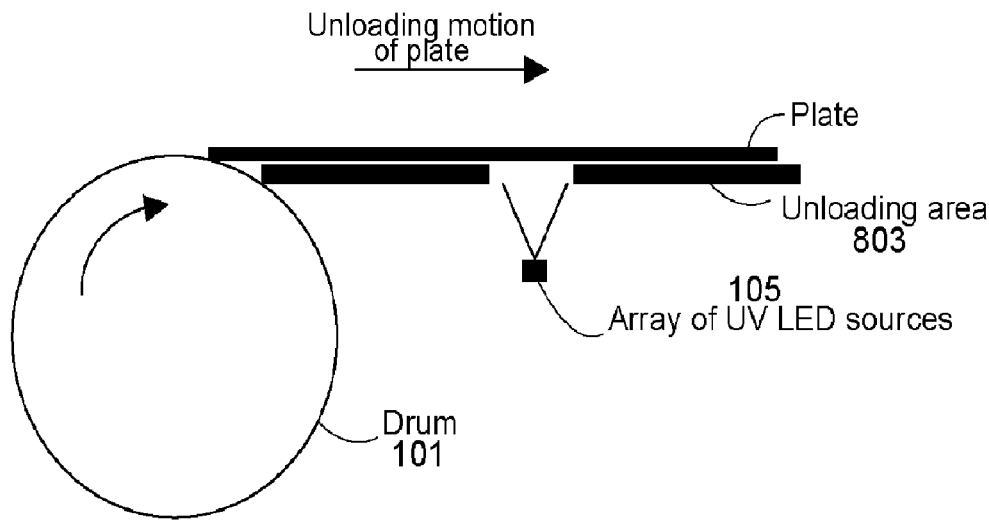

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 17 is confirmed.

Claim 18 is determined to be patentable as amended.

Claims 1-16 were not reexamined.

18. A method comprising:

placing a printing plate with photo-curable material thereon on an imaging device, wherein the plate initially has ablatable masking material on the photo-curable material, *the ablatable material forming the front of the plate before imaging*;

imaging the plate according to imaging data to form an imaged plate, wherein the imaging includes ablating some of the ablatable masking material *on the plate's front* on the photo-curable material according to the imaging data to form a mask ablated according to the imaging data on the *front of the* plate, such that the imaged [plate] *plate's front* includes the mask ablated according to the imaging data;

[removing the imaged plate; and]

applying UV radiation to the back of the printing plate or to both the front and the back of the printing plate, *including applying UV radiation to the back of the plate* using a plurality of UV emitting LEDs during [or after]the placing of the plate [or the removing of the imaged plate], *and*

*removing the imaged plate,* wherein the printing plate is a photopolymer flexographic plate initially having the ablatable masking material thereon, a photopolymer letterpress plate initially having the ablatable masking material thereon, or a photopolymer sleeve initially having the ablatable masking material thereon.

\* \* \* \* \*